PULSE AMPLITUDE LIMITER FOR FREQUENCY CONTROL CIRCUIT OF TWT OSCILLATOR IN FREQUENCY AGILE RADAR SYSTEM

Filed April 1, 1966

INVENTORS
L. J. BROCATO
A. H. VALENTINE
BY Harry A. Herbert Jr
ATTORNEYS
James S. Shannon
AGENT 3,333,268
Patented July 25, 1967

3,333,268

PULSE AMPLITUDE LIMITER FOR FREQUENCY CONTROL CIRCUIT OF TWT OSCILLATOR IN FREQUENCY AGILE RADAR SYSTEM

Louis J. Brocato, Baltimore, and Albert H. Valentine, Annapolis, Md., assignors, by mesne assignments, to the United States of America as represented by the Secretary of the Air Force Filed Apr. 1, 1966, Ser. No. 540,162
2 Claims. (Cl. 343—17.1)

ABSTRACT OF THE DISCLOSURE

A network of precise limiting circuits for setting the amplitudes of a series of pulses to different values in accordance with a predetermined program. Each pulse of the series is applied to a separate limiting circuit the outputs of which are connected in parallel through isolating diodes. Each limiting circuit comprises a shunt zener diode for rough limiting and a biased transistor for precise limiting.

A requirement of frequency agile radar systems, or systems in which the frequency of the radiated energy is varied from pulse to pulse, is a pulse to pulse programming of the TWT (traveling wave tube) oscillator that supplies the radio frequency. The programming is done with a series of pulses whose amplitudes are preset for the required frequencies. These amplitudes are extremely critical, and it is the purpose of this invention to provide relatively simple apparatus for holding the amplitudes of the frequency programming pulses within very close limits.

Briefly, the apparatus in accordance with the invention comprises a plurality of similar limiting circuits in a one-to-one correspondence with the pulses of the frequency programming series. Each pulse of the series is applied to the input of the corresponding limiting circuit, the outputs of which are connected in parallel through isolating diodes to the voltage tuning circuit of the TWT. Each limiting circuit comprises a shunt zener diode, having a breakdown voltage slightly above the desired output voltage, as a rough limiter, and a biased transistor for precise limiting of the output pulse.

A more detailed description of the invention will be given with reference to the accompanying drawing in which.

Figure 1:
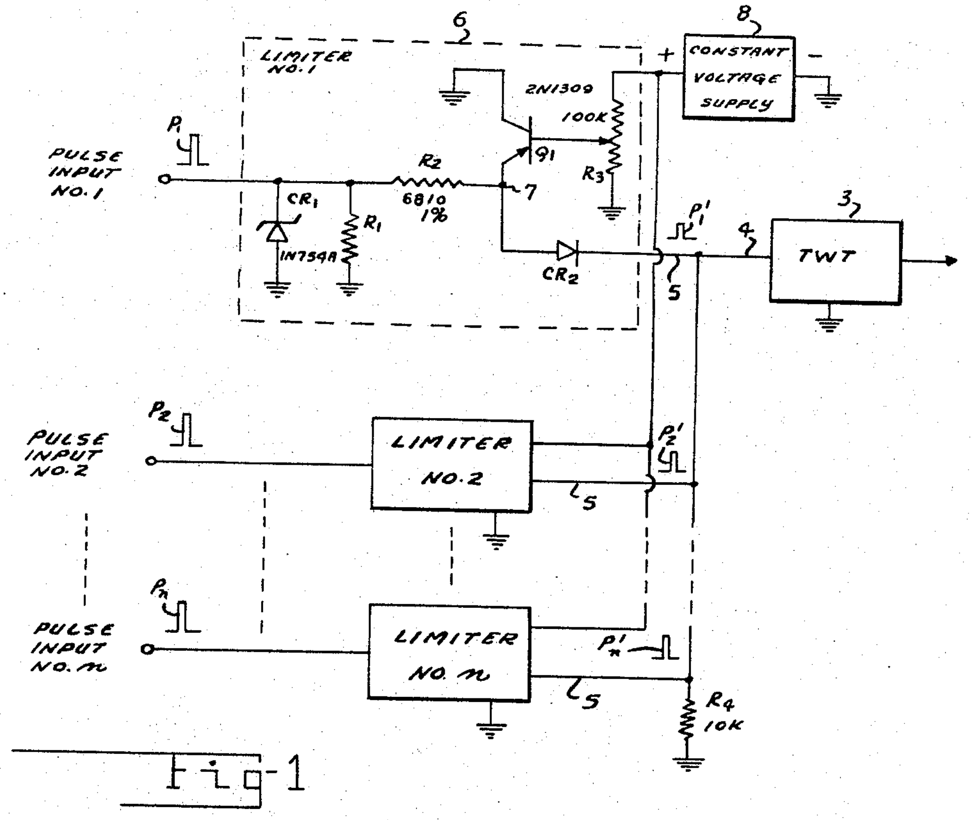
FIG. 1 is a schematic diagram of the limiter system.

Referring to the embodiment shown in FIG. 1 of the drawing, block 3 represents a traveling wave tube oscillator the frequency of which may be controlled by a voltage applied to the voltage tuning circuit 4 in conventional manner. In the system illustrated, voltage pulses, for example of 50 microsecond duration, are applied to circuit 4. The oscillator is normally inoperative, but is keyed by the voltage pulse to produce an output pulse of radio frequency of the same duration as the voltage pulse and of a frequency determined by the amplitude of the voltage pulse.

The sequence of programming pulses $p_1, p_2 \ldots p_n$, where $n$ may be 32, for example, are applied to the corresponding limiter circuits Nos. 1, 2 . . . $n$ and result in output pulses $p_1', p_2' \ldots p_n'$ at the limiter output circuits 5 which are connected in parallel to the voltage frequency control circuit 4 of TWT 3. The amplitude of each input pulse must exceed the desired output pulse amplitude, however all input pulses may be of the same amplitude. The amplitude of each output pulse depends upon the limiting level set into the corresponding limiter circuit. The limiting levels may be set to achieve any desired program of output pulse amplitude. Also, pulses may be applied to the limiter inputs in a repeating succession or randomly.

Block 6 contains a schematic diagram of one of the limiting circuits. As stated earlier, the amplitude of input pulse $p_1$ must exceed the desired output pulse amplitude, preferably by more than one volt. Shunt connected zener diode $CR_1$ should preferably have a breakdown voltage approximately one volt above the maximum desired output voltage. Resistor $R_1$ serves as a ground return for an isolating diode (not shown) in the input circuit. The pulse voltage appearing across $R_1$ is also applied across a potential divider consisting of $R_2$, output isolating diode $CR_2$, and $R_4$ connected in series, that portion appearing across $R_4$ being applied as the output pulse to frequency control circuit 4 of TWT 3. The potential at point 7, which is substantially that of the output pulse since the drop across $CR_2$ is negligible, is applied to the emitter of transistor $Q_1$, the collector of which is at ground potential and the base of which has a fixed reference potential above ground as determined by the setting of adjustable potential divider $R_3$ energized from constant voltage source 8.

Transistor $Q_1$ serves to limit the output pulse to a maximum voltage which may be set at a desired value by $R_3$. When the emitter potential of $Q_1$ exceeds the base potential established by $R_3$, $Q_1$ in effect short circuits point 7 to ground preventing any further rise in the potential at this point, and thereby limiting the output pulse to a maximum voltage preset at $R_3$. Shortly after this limiting action takes place, $CR_1$ breaks down and prevents any further upward pressure on the voltage at point 7. In this manner a very precise limiting of the output pulse voltage is achieved. For a 6-volt output pulse the variation is less than 0.001 volt, for example.

The isolating diode $CR_2$ provides the limiter with a very high output impedance so that a large number of outputs may be paralleled without difficulty.

Figure 2:
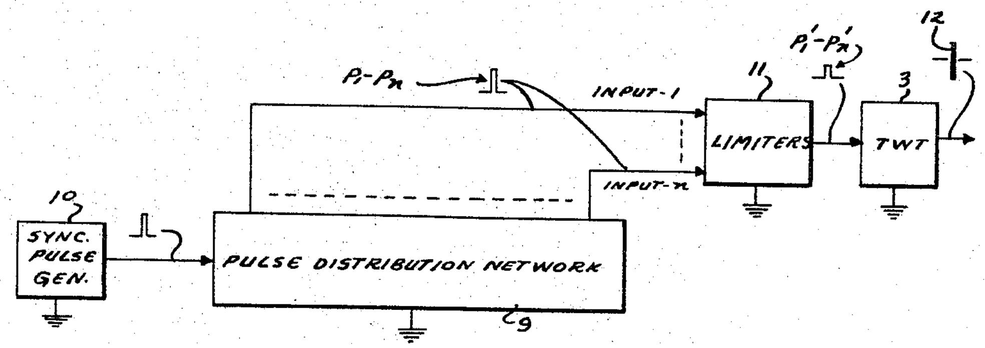
FIG. 2 shows the relationship of the limiter system to certain other components of the radar system.

FIG. 2 shows in a general way the manner in which pulses are applied to the limiter system. A pulse distribution network 9 receives pulses at a constant pulse repetition rate from the synchronizing pulse generator 10 of the radar system and applies these or corresponding voltage pulses to the limiter system 11, the details of which have been shown in FIG. 1. The voltage pulses may be applied to the limiter inputs in a repeating sequence, randomly, or in any other desired order with network 9 being designed for the particular order desired, the design of this network not being a part of the invention. The pulses applied by the limiting system 9 to the TWT have various amplitudes and produce output pulses 12 of various radio frequencies, as already explained, these being the pulses radiated by the radar system.

We claim:

1. In a frequency agile radar system having a traveling wave tube oscillator for producing radio frequency energy at a frequency determined by the voltage applied to a control circuit, apparatus for applying voltage pulses having a constant repetition rate and a pulse-to-pulse amplitude variation to said control circuit for keying said oscillator and for producing a pulse-to-pulse frequency variation of the oscillator, said apparatus comprising: a plurality of amplitude limiting circuits each having an input circuit and an output circuit and each having adjustable means for limiting the output voltage to a preset value different from the preset value of the other circuits; a load resistor common to the outputs of said limiting circuits and coupled into said output circuits through diodes that isolate each limiting circuit from the others; a zener diode connected in shunt to the input of each limiting circuit and having a breakdown voltage slightly greater than the input voltage required to reach the preset output voltage limit of the circuit; means for applying the pulses of a series of voltage pulses occurring at a constant pulse repetition rate to said limiting circuit inputs in accordance with a predetermined program, the amplitude of each voltage pulse being not less than that required to reach the output limit of the limiting circuit to which it is applied; and means for applying the resulting limited voltage pulses appearing across said load resistor to the control circuit of said oscillator.

2. Apparatus as claimed in claim 1 in which each of said limiting circuits comprises an additional resistor connected in series with the associated isolating diode and said common load resistor across its input circuit; a transistor having its emitter connected to the junction of said additional resistor and said diode and its collector connected to the end of said load resistor remote from said diode, whereby the emitter-collector path of said transistor is in shunt to the series combination of said isolating diode and said common load resistor; and adjustable means for applying a constant backward bias to the emitter-base junction of said transistor.

References Cited

UNITED STATES PATENTS

| | | | |
|---|---|---|---|
| 3,051,906 | 8/1962 | Haynes | 328—61 X |
| 3,298,025 | 1/1967 | Fumea | 343—17.1 |

RODNEY D. BENNETT, *Primary Examiner.*

C. L. WHITHAM, *Assistant Examiner.*